(12) United States Patent
Herner

(10) Patent No.: US 8,993,397 B2
(45) Date of Patent: Mar. 31, 2015

(54) PILLAR STRUCTURE FOR MEMORY DEVICE AND METHOD

(71) Applicant: Crossbar, Inc., Santa Clara, CA (US)

(72) Inventor: Scott Brad Herner, San Jose, CA (US)

(73) Assignee: Crossbar, Inc., Santa Clara, CA (US)

(*) Notice: Subject to any disclaimer, the term of this patent is extended or adjusted under 35 U.S.C. 154(b) by 0 days.

(21) Appl. No.: 14/011,577

(22) Filed: Aug. 27, 2013

(65) Prior Publication Data

US 2014/0127876 A1     May 8, 2014

Related U.S. Application Data

(63) Continuation of application No. 13/465,188, filed on May 7, 2012, now Pat. No. 8,519,485, which is a continuation of application No. 13/158,231, filed on Jun. 10, 2011, now Pat. No. 8,198,144.

(60) Provisional application No. 61/354,166, filed on Jun. 11, 2010.

(51) Int. Cl.
*H01L 21/44*     (2006.01)
*H01L 21/332*     (2006.01)
(Continued)

(52) U.S. Cl.
CPC .......... *H01L 45/1675* (2013.01); *H01L 45/148* (2013.01); *H01L 45/1608* (2013.01); *H01L 45/1666* (2013.01)
USPC ........... 438/257; 438/133; 438/255; 438/624; 438/652; 257/E21.233; 257/E21.41; 257/E21.476; 257/E21.645

(58) Field of Classification Search
None
See application file for complete search history.

(56) References Cited

U.S. PATENT DOCUMENTS

| | | | |
|---|---|---|---|
| 680,652 | A | 8/1901 | Elden |
| 4,433,468 | A | 2/1984 | Kawamata |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Jian Hu et al., "Area-Dependent Switching In Thin Film-Silicon Devices", Materials Research Society, Mal. Res. Soc. Symp Proc., 2003, pp. A18.3.1-A18.3.6, vol. 762.

(Continued)

*Primary Examiner* — Mohsen Ahmadi
(74) *Attorney, Agent, or Firm* — Ogawa P.C.

(57) ABSTRACT

A method of forming a memory device. The method provides a semiconductor substrate having a surface region. A first dielectric layer is formed overlying the surface region of the semiconductor substrate. A bottom wiring structure is formed overlying the first dielectric layer and a second dielectric material is formed overlying the top wiring structure. A bottom metal barrier material is formed to provide a metal-to-metal contact with the bottom wiring structure. The method forms a pillar structure by patterning and etching a material stack including the bottom metal barrier material, a contact material, a switching material, a conductive material, and a top barrier material. The pillar structure maintains a metal-to-metal contact with the bottom wiring structure regardless of the alignment of the pillar structure with the bottom wiring structure during etching. A top wiring structure is formed overlying the pillar structure at an angle to the bottom wiring structure.

18 Claims, 12 Drawing Sheets

(51) Int. Cl.
*H01L 21/336* (2006.01)
*H01L 21/8242* (2006.01)
*H01L 45/00* (2006.01)

(56) References Cited

U.S. PATENT DOCUMENTS

| | | |
|---|---|---|
| 4,684,972 A | 8/1987 | Owen et al. |
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyj et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 8,441,835 B2 | 5/2013 | Jo et al. |
| 8,450,713 B2 * | 5/2013 | Awaya et al. .............. 257/3 |
| 8,467,227 B1 | 6/2013 | Jo |
| 8,587,989 B2 | 11/2013 | Manning et al. |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |

(56) References Cited

U.S. PATENT DOCUMENTS

| | | |
|---|---|---|
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0020548 A1 | 1/2013 | Clark et al. |

FOREIGN PATENT DOCUMENTS

| | | |
|---|---|---|
| JP | 2005-506703 A | 3/2005 |
| JP | 2006-032951 A | 7/2005 |
| JP | 2007-281208 A | 4/2006 |
| JP | 2007-328857 A | 6/2006 |
| JP | 2007-067408 A | 8/2006 |
| KR | 1020110014248 A | 2/2011 |
| WO | WO 03/034498 A1 | 4/2003 |
| WO | WO 2009/005699 A1 | 1/2009 |

OTHER PUBLICATIONS

Andre Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status And Outlook of Emerging Nonvolatile Memory Technologies", IEEE, 2004, pp. 567-570.

A.E. Owen et al., "Memory Switching In Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

(56) References Cited

OTHER PUBLICATIONS

K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs. acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.

(56) References Cited

OTHER PUBLICATIONS

Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al., "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Aug. 27, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Notice of Allowance for U.S. Appl. No. 13/725,331, dated Jan. 17, 2014.
Office Action for U.S. Appl. No. 13/739,283 dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.

(56) References Cited

OTHER PUBLICATIONS

Office Action for U.S. Appl. No. 13/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 14/072,657, dated Jun. 17, 2014.

* cited by examiner

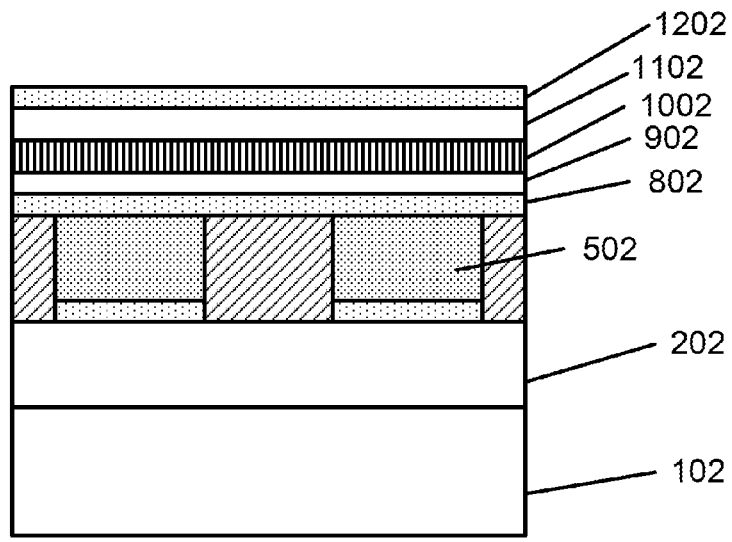
Fig. 12
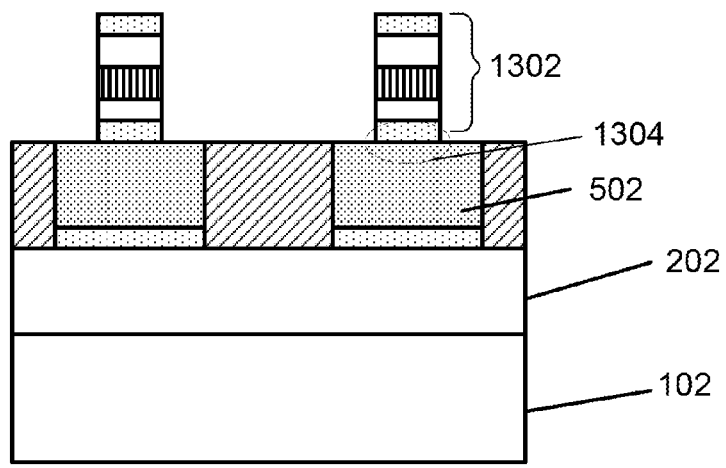
Fig. 13
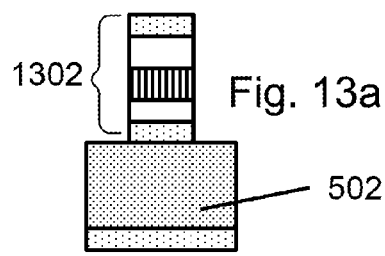 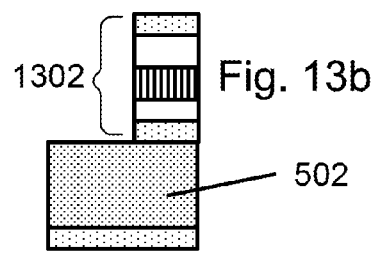

PILLAR STRUCTURE FOR MEMORY DEVICE AND METHOD

CROSS-REFERENCES TO RELATED APPLICATIONS

This patent application is a continuation of U.S. application Ser. No. 13/465,188 filed on May 7, 2012, which is a continuation of U.S. application Ser. No. 13/158,231 filed on Jun. 10, 2011, which is a non-provisional of U.S. Application No. 61/354,166. All are incorporated by reference in their entirety herein for all purposes.

BACKGROUND

The present invention is related to switching devices. More particularly, the present invention provides a structure and a method for forming a non-volatile resistive switching memory device having desirable characteristics.

The success of semiconductor devices has been mainly driven by an intensive transistor down-scaling process. However, as field effect transistor (FET) approach sizes less than 100 nm, problems such as short channel effect start to prevent proper device operation. Moreover, transistor based memories such as those commonly known as Flash can have additional performance degradations as device sizes shrink. For example, a high voltage is usually required for programming of a Flash memory device. The high voltage can result in dielectric breakdown and increases the possibility of disturb mechanisms. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures coupled with a silicon-based device to form a memory cell. However, these new memory cells usually lack one or more key attributes, which have prevented their widespread adoption in high volume products. For example, Fe-RAM and MRAM devices have fast switching characteristics, that is, the time to switch between a "0" and a "1," and good programming endurance, but their fabrication is not compatible with standard silicon fabrication, and the resulting memory cell may not be easy to scale to small sizes. Switching for a PCRAM device uses Joules heating, which inherently has high power consumption. Organic RAM or ORAM is incompatible with large volume silicon-based fabrication and device reliability is usually poor.

From the above, an improved semiconductor memory device that can scales to smaller dimension and techniques are therefore desirable.

BRIEF SUMMARY OF THE PRESENT INVENTION

The present invention is directed to memory devices. More particularly, embodiments according to the present invention provide a method to form a plurality of pillar structures for an array of switching devices. The pillar structures allow for fabrication of high density memory. The method has been applied to non-volatile memory device, but it should be recognized that embodiment according to the present invention can have a much broader range of applicability.

In a specific embodiment, a method for forming a pillar structure for a switching device is provided. The method includes providing a semiconductor substrate having a surface region and forming a first dielectric layer overlying the surface region of the semiconductor substrate. A bottom wiring structure is formed overlying the first dielectric layer. In a specific embodiment, the bottom wiring structure includes at last a first conductor material, such as a metal material. A second dielectric material is formed overlying the top wiring structure. In a specific embodiment, the second dielectric material is planarized to expose a bottom wiring structure surface. The method includes forming a bottom metallic barrier material overlying the second dielectric layer surface and the bottom wiring structure surface. In a specific embodiment, the bottom metallic barrier material forms a metal-to-metal contact with the bottom wiring structure. The method deposits a contact material overlying the bottom wiring material and a switching material overlying the contact material. In a specific embodiment, a conductive material is formed overlying the switching material and a top barrier material is formed overlying the conductive material. In a specific embodiment, the method performs a patterning and etching process to form a plurality of pillar structures from at least the bottom metallic barrier material, the contact material, the switching material, the conductive material, and the top barrier material. In certain embodiments, the pillar structure is not aligned to the bottom wiring structure and maintains the metal-to-metal contact with the bottom wiring structure. A third dielectric material is formed overlying at least the plurality of pillar structures and the third dielectric material is planarized to expose a surface region of the pillar structure. The method then forms a top wiring structure including at least a second conductor material overlying at least the exposed surface region of the pillar structure.

Many benefits can be achieved by ways of the present invention. For example, the present invention provides a way to form a pillar structure for a switching device, which can be used in high density non-volatile memory devices. In a specific embodiment, the method provides a less stringent etching condition to form the pillar structure while maintaining electrical contact with a wiring structure for proper functioning of the switching device. In a specific embodiment, the present invention provides a high yield method for manufacturing high density memory devices. The metal-to-metal contact between the bottom wiring structure and the pillar structure relaxes a requirement for precise overlay of the pillar structure to the bottom wiring structure, which increases device yield. Additionally, the present method segments the fabrication of the device into forming of each of the orthogonal wire structures and the pillar structure. Etching of each of these pillar structures is easier as aspect ratio (ratio of height to width of a structure) of each of these pillar structures is reduced compared to etching the memory cell and wiring in one step. Additionally, filling gaps with respective dielectric material is also easier for reduced aspect ratios. Depending on the application, one or more of these benefits may be achieved. One skilled the art would recognize other variations, modifications, and alternatives.

SUMMARY OF THE DRAWINGS

FIGS. 1-17 are simplified diagrams illustrating a method of forming a memory device according to an embodiment of the present invention.

DETAILED DESCRIPTION OF THE PRESENT INVENTION

The present invention is generally related to a switching device. More particularly, embodiments of the present invention provide a structure and a method for forming a plurality of resistive switching devices each having a pillar structure. The present invention has been applied to fabrication of high density non-volatile memory devices. But it should be recognize that embodiments according to the present invention would have a much broader range of applicability.

FIGS. 1-17 illustrate a method of forming a switching device according to embodiments of the present invention. These diagrams are merely examples and should not unduly limit the claims herein. One skilled in the art would recognize other variations, modifications, and alternatives.

Figure 1:
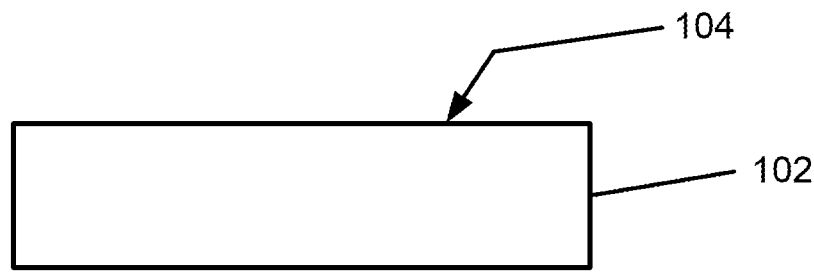

As shown in FIG. 1, a substrate 102 having a surface region 104 is provided. The substrate can be a semiconductor substrate in a specific embodiment. The semiconductor substrate can be a single crystal silicon wafer, a silicon germanium wafer, or a silicon-on-insulator substrate, commonly known as SOI, and the like, depending on the application. Depending on the embodiment, the substrate can have one or more devices such as one or more transistor devices formed thereon. The one or more devices may be operationally coupled to the switching device in a specific embodiment.

Figure 2:
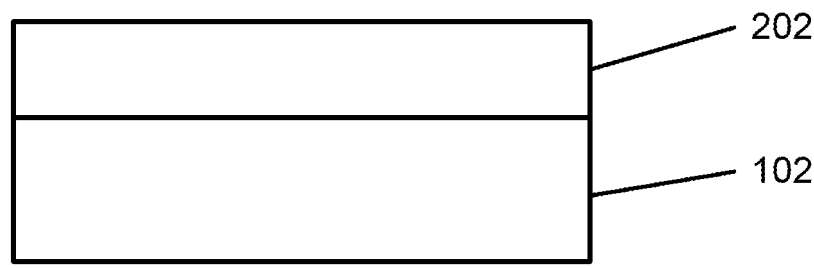

Referring to FIG. 2, the method forms a first dielectric material 202 overlying the surface region of the semiconductor substrate. The first dielectric material can be a suitable dielectric material such as silicon oxide, silicon nitride or combinations thereof depending on the embodiment. The first dielectric material can be deposited using techniques such as chemical vapor deposition (CVD) process including plasma enhanced chemical vapor deposition or low pressure chemical vapor deposition depending on the application. For example, silicon oxide may be formed using silane, disilane, a suitable chlorosilane or TEOS and other suitable silicon bearing materials, depending on the embodiment.

In a specific embodiment, the method forms a first adhesion layer 302 overlying the first dielectric material. The first adhesion layer can be titanium, titanium nitride, tantalum, tantalum nitride, or tungsten nitride or a combination of these. The first adhesion layer may be deposited using a physical vapor deposition process such as sputtering in a specific embodiment. Techniques such as a chemical vapor deposition using a suitable precursor may also be used. For example, adhesion layer 302 may be formed by first depositing a titanium metal on the first dielectric material, following by sputtering a titanium nitride material.

Figure 4:
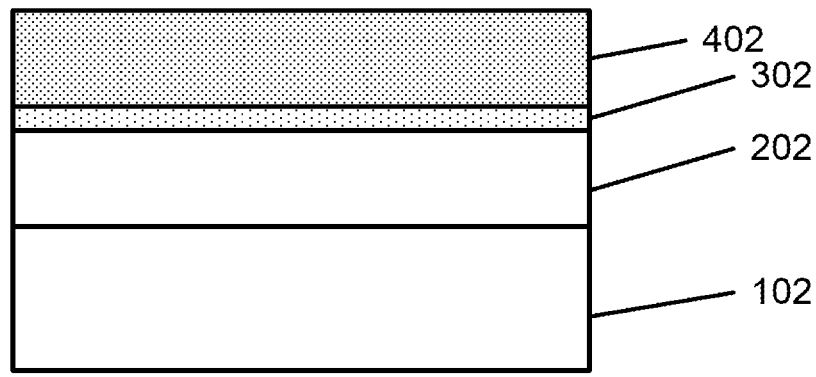

Referring to FIG. 4, the method forms a first wiring material 402 overlying the first adhesion layer. The first wiring material can be tungsten, copper, aluminum or other suitable metal materials including alloys. The first wiring material can be deposited using techniques such as physical vapor deposition, evaporation, chemical vapor deposition, electrochemical methods such as electroplating or electrode-less deposition from a liquid medium, or other suitable deposition techniques including a combination. In certain embodiments, the first wiring material can be a doped semiconductor material such as a doped silicon material. In a specific embodiment, the first adhesion layer functions as a glue layer between the first wiring material and the first dielectric layer. In a specific embodiment, tungsten is formed by sputtering on top of layer 302 to form layer 402. The tungsten may have a thickness of between 100 nm and 1000 nm thick, and preferably between 200 nm and 500 nm thick.

Figure 5:
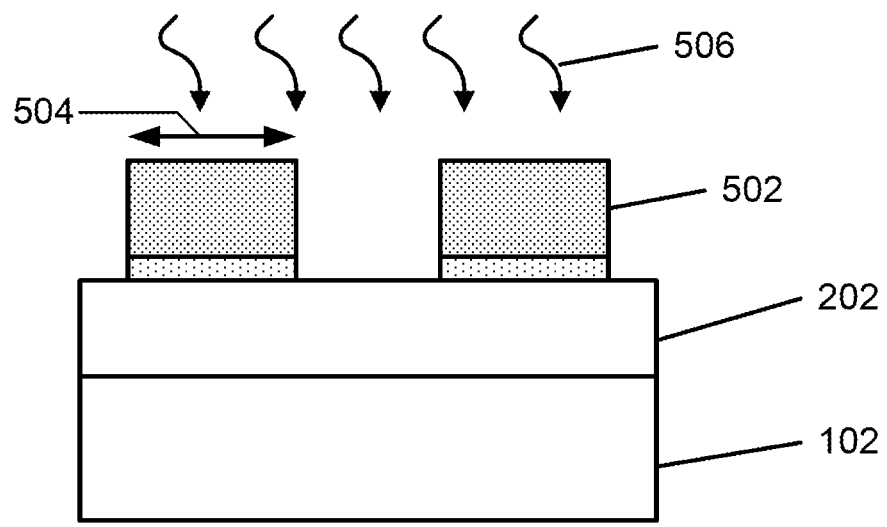

The method performs a first pattern and etch process 506 to form a first wiring structure 502 as shown in FIG. 5. The first wiring structure includes the first wiring material and the first adhesion material in a specific embodiment. As shown, the first wiring structure is characterized by a width 504. The first pattern and etch process includes forming a masking layer overlying the first wiring material followed by an etching process. The masking layer can be an organic photoresist material or a hard mask depending on the application. Taking tungsten as the first wiring material as an example, the first adhesion layer can be titanium nitride in a specific embodiment. The etching process can use a fluorine bearing species such as $CF_4$ as etchant in a specific embodiment. In a specific embodiment, the first wiring structure can have a width ranging from about 5 nm to about 1200 nm. In other embodiments, the width can range from about 30 nm to about 100 nm. Of course one skilled in the art would recognize other variations, modifications, and alternatives.

Figure 6:
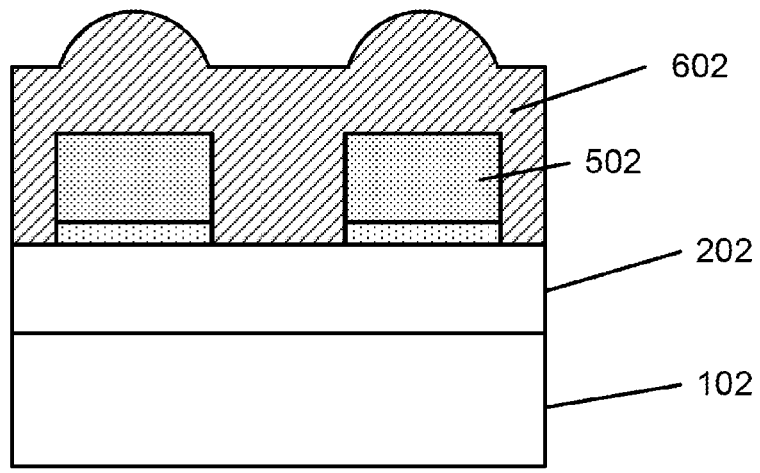

In a specific embodiment, the method includes forming a second dielectric material 602 overlying the first wiring structure as illustrated in FIG. 6. The second dielectric material can be silicon oxide, silicon nitride, or any suitable dielectric material including a dielectric stack and a combination of various dielectric materials depending on the embodiment. As merely an example, the second dielectric material can be a silicon oxide deposited using a plasma enhanced chemical vapor deposition (PECVD) process using tetra-ethyl oxysilicate (TEOS) as precursor in a specific embodiment. Other deposition method such as spin on glass followed by a suitable curing step may be used. Alternatively, a combination of more than one deposition processes may be used depending on the application.

Figure 7:
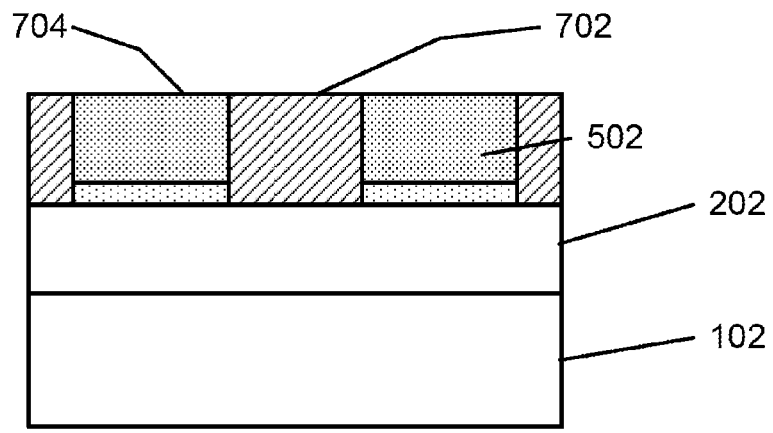

Referring to FIG. 7, the method includes performing a planarizing process to form a planarized second dielectric layer surface region 702 and expose a first wiring structure surface 704 in a specific embodiment. The planarizing process can be a chemical mechanical polishing (CMP) process using the first wiring (for example, tungsten) structure surface as a polishing stop in a specific embodiment. The planarizing process can be a selective etch process such as a reactive ion etching using the first wiring (for example, tungsten) structure surface as an etch stop in specific embodiment.

Figure 8:
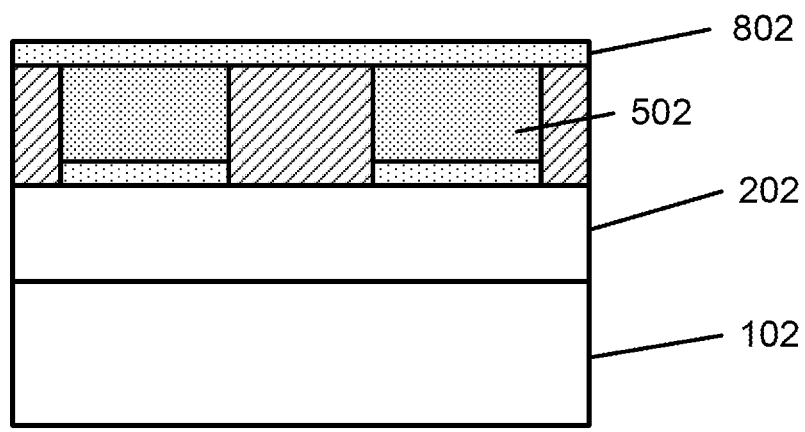

The method deposits a bottom metallic barrier material 802 overlying the planarized second dielectric layer surface region including the exposed first wiring structure surface as shown in FIG. 8. Bottom metallic barrier material 802 can be titanium, titanium nitride, tantalum, tantalum nitride, or tungsten nitride or a combination of these. The bottom metallic barrier material may be deposited using a physical vapor deposition process such as sputtering in a specific embodiment. Techniques such as a chemical vapor deposition using a suitable precursor may also be used.

Figure 9:
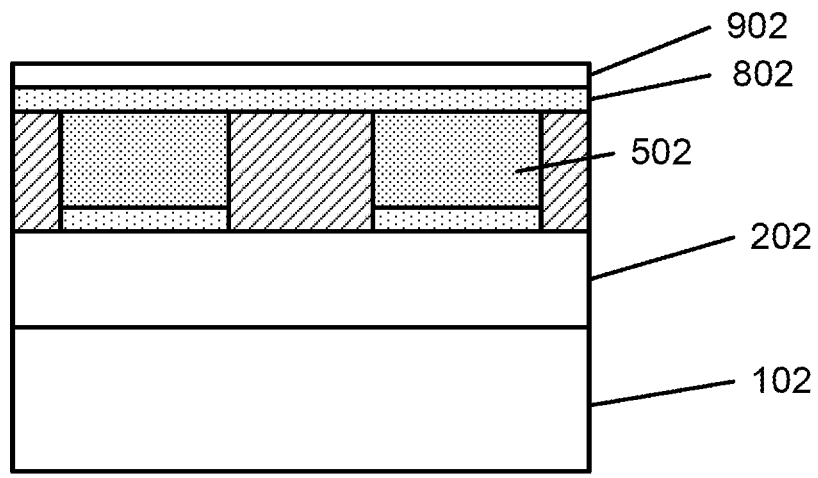

As shown in FIG. 9, the method includes depositing a contact layer 902 overlying the bottom metallic barrier material. In certain embodiments, the contact layer serves to control and improve switching for the switching device. For example for a switching device using amorphous silicon as the switching material, the contact layer can be a polysilicon material in a specific embodiment. The polysilicon material is p-doped using a boron bearing species at a boron atomic concentration ranging from about 1E18 per $cm^3$ to about 1E22 per $cm^3$ in a specific embodiment. In a specific embodiment, the polysilicon material is formed using a plasma enhanced chemical vapor deposition process or a low pressure chemical vapor deposition process and a silicon bearing species such as silane, disilane, a suitable chlorosilane, and others. The impurity species may be doped, in-situ, or ex-situ depending in the embodiment. Deposition temperature ranges from about 300 Degree Celsius to about 550 Degree Celsius depending on the embodiment. In an alternative embodiment, the contact layer can be a polycrystalline silicon germanium material having a p+ impurity characteristic. The polycrystalline silicon germanium material having the p+ impurity characteristic can be formed using a plasma enhanced chemical vapor deposition process or a low pressure chemical vapor deposition process, or others, using a suitable silicon precursor, a suitable germanium precursor, and a suitable p type impurity species. The silicon precursor can be silane, disilane, a suitable chlorosilane, and others. The germanium precursor can be germane ($GeH_4$), germanium chloride ($GeCl_4$), and other suitable germanium bearing species. The p+ impurity can be provided using a boron bearing species, an aluminum bearing species, a gallium bearing species, an indium bearing species, and others. Deposition temperature for the polycrystalline silicon germanium material having the p+ impurity characteristic can range from about 350 Degree Celsius to about 500 Degree Celsius and can be formed polycrystalline and dopant activated without subjecting to an anneal step.

Figure 10:
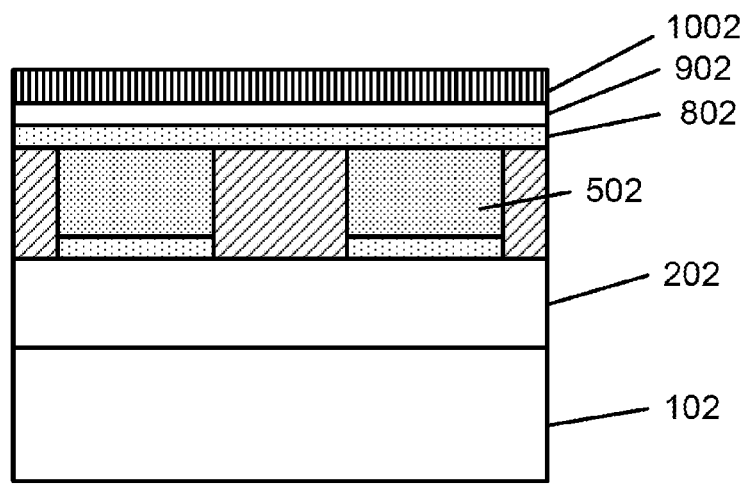

The method includes forming a switching material 1002 overlying the contact layer as shown in FIG. 10. The switching material can be an intrinsic amorphous silicon material, that is not intentionally doped, in a specific embodiment. The intrinsic amorphous silicon material can be deposited using a chemical deposition method or a physical deposition method depending on the embodiment. The chemical deposition method can include a chemical vapor deposition process using silane, disilane, a suitable chlorosilane, or a suitable silicon-containing gas as a precursor. In a specific embodiment, the intrinsic amorphous silicon material may be deposited using a plasma-assisted chemical deposition method. Deposition temperature for the amorphous silicon material can range from about 200 Degree Celsius to about 500 Degree Celsius and preferably at about 350 Degree Celsius to about 400 Degree Celsius. Depending on the embodiment, the amorphous silicon material can be provided at a thickness ranging from about 5 nm to about 100 nm. In a preferred embodiment, the amorphous silicon material is provided at a thickness ranging from about 10 nm to about 50 nm. Depending on the application, the amorphous silicon material may also be deposited using a physical vapor deposition such as sputtering using a suitable silicon target material.

Figure 11:
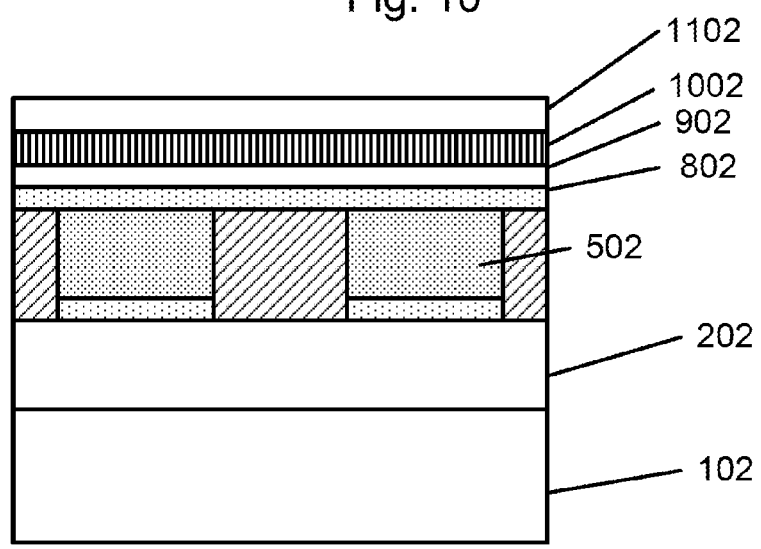

In a specific embodiment, the method deposits a conductive material 1102 overlying switching material as shown in FIG. 11. In a specific embodiment, for an amorphous silicon switching material, conductive material 1102 can comprise a silver material. The silver material can be deposited using a physical deposition process such as sputtering or evaporation. The silver material may also be formed using a chemical deposition process such as chemical vapor deposition, electrochemical such as electroplating, electrodeless deposition, or a combination depending on the application. The method deposits a top barrier material 1202 overlying the conductive material as shown in FIG. 12. Top barrier material 1202 layer can protect the conductive material, for example, the silver material, from oxidation in a specific embodiment. Top barrier material 1202 can also serve as a diffusion barrier between conductive material 1102 and subsequent materials, and forms an electrical contact between conductive material 1102 and subsequent materials. Top barrier material 1202 can also serve as a polish stop material in a subsequent step for a CMP process. Top barrier material 1202 can be titanium, titanium nitride, tantalum or tantalum nitride, tungsten, or tungsten nitride, or any suitable barrier material depending on the embodiment. Depending on the application, top barrier material 1202 can be formed using a chemical deposition such as atomic layer deposition, chemical vapor deposition, and others, or a physical deposition such as sputtering, depending on the application.

In a specific embodiment, the method includes subjecting a stack of material comprising the bottom metallic barrier material, the contact material, the switching material, the conductive material, and the top barrier material to a second pattern and etch process to form a plurality of pillar structures 1302 as shown in FIG. 13. Each of the pillar structure includes the bottom metallic barrier material, the contact material, the switching material, the conductive material, and the top barrier material. As shown, each of the pillar structure including the bottom metallic barrier material maintains a metal-to-metal contact 1304 with the first wiring structure in a specific embodiment. Depending on the embodiment, the pillar structure can be aligned to the bottom wiring structure as shown in FIG. 13*a*. The pillar structure may not be perfectly aligned to the first wiring structure as shown in FIG. 13*b* while maintaining the metal-to-metal contact in a specific embodiment.

Figure 14:
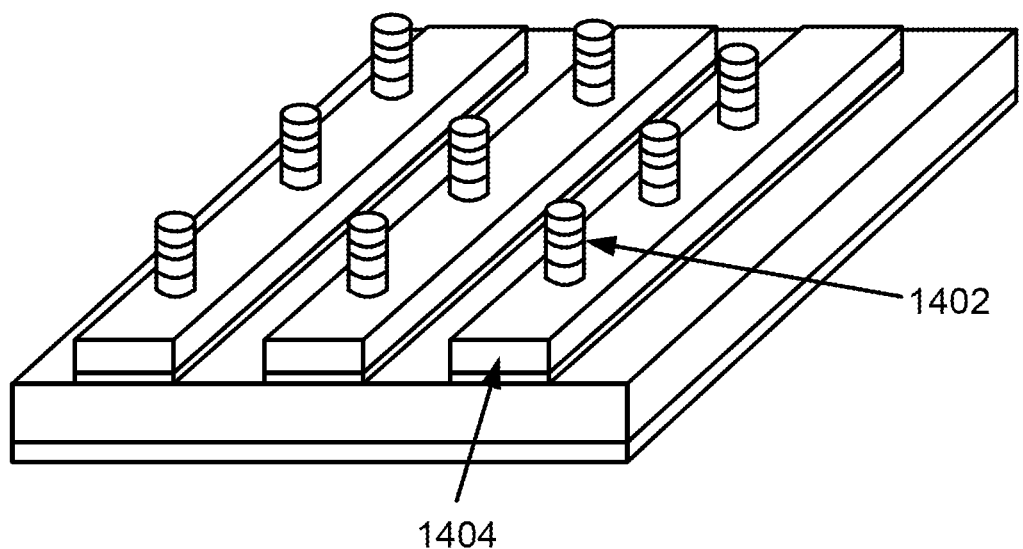
Figure 15:
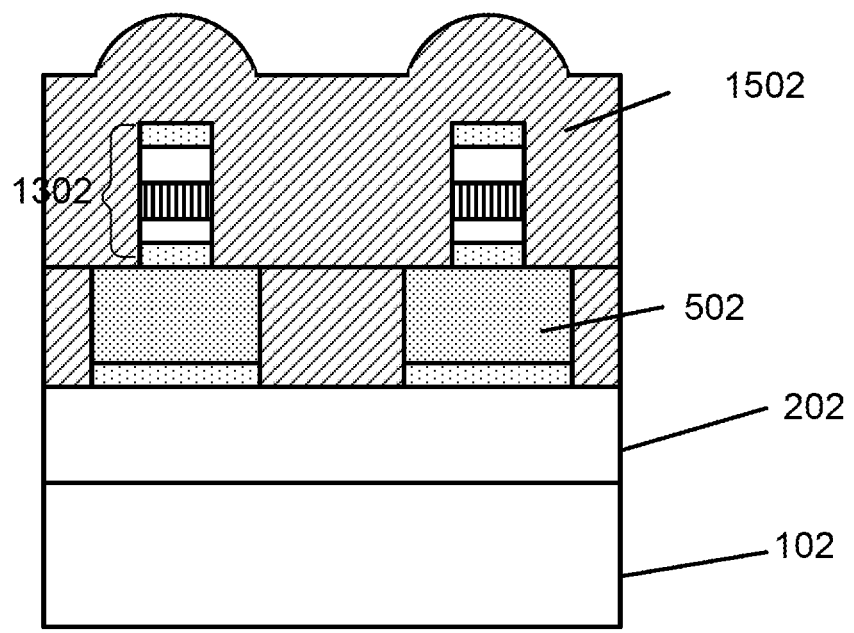

As merely an example, the pillar structure can have a feature size of less than about 250 nm and preferably about 90 nm, or even 40 nm, depending on the technology node adopted. The bottom wiring structure can have a width of about 90 nm or greater. The pillar structure with a bottom metallic barrier material enables a metal-to-metal contact with the first wiring structure even when there is a misalignment of the pillar structure to the first wiring structure during the second pattern and etch process in a specific embodiment. A perspective view of a plurality of pillar structures 1402 on the first wiring structure 1404 is illustrated in FIG. 14.

After forming the pillar structures, the method includes depositing a third dielectric material 1502 overlying at least the plurality of pillar structures including exposed regions of the first wiring structures. The third dielectric material can be silicon oxide, silicon nitride, or suitable dielectric material including a dielectric stack with a combination of various dielectric materials depending on the embodiment. As merely an example, the third dielectric material can be a silicon oxide deposited using a plasma enhanced chemical vapor deposition (PECVD) process using tetra-ethyl oxy-silicate as precursor in a specific embodiment. Other deposition method such as spin on glass followed by a suitable curing step may be used. Alternatively, a combination of deposition processes may be used depending on the application.

Figure 16:
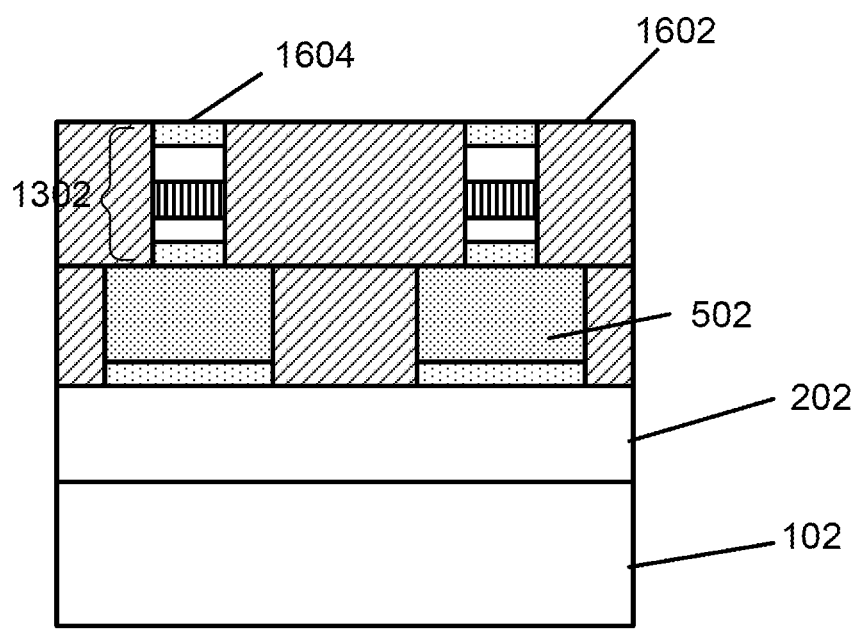

In a specific embodiment, the third dielectric layer is subjected to a planarizing process to form a planarized third dielectric layer surface 1602 and exposing a top surface region 1604 of the pillar structure as shown in FIG. 16. The exposed top surface region of the pillar structure includes a surface region of the top barrier material in a specific embodiment. The planarizing process can be a chemical mechanical polishing (CMP) process using the top barrier material as a polishing stop in a specific embodiment. The planarizing process can be a selective etch process such as a reactive ion etching using the top barrier material surface as an etch stop in specific embodiment. Of course one skilled in the art would recognize other modifications, variations, and alternatives.

Figure 17:
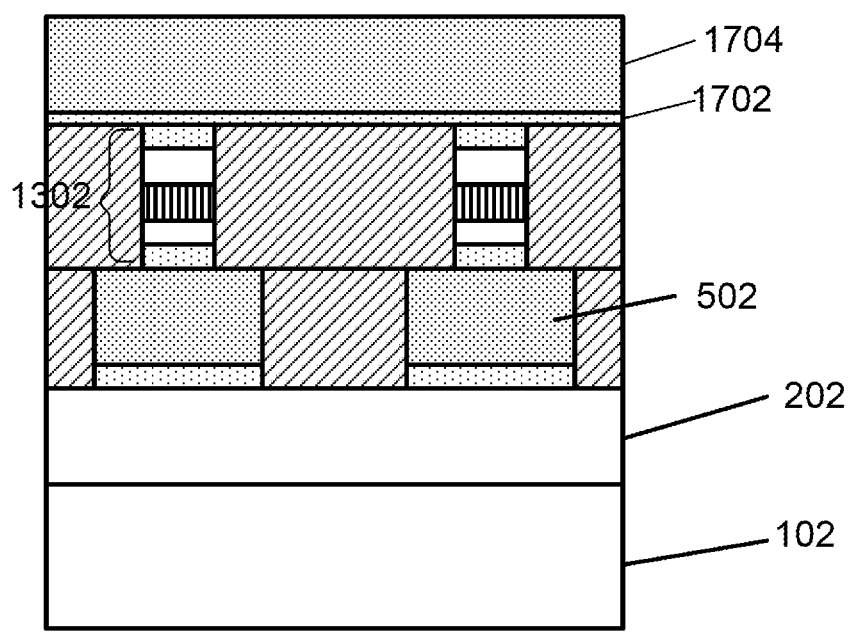
Figure 18:
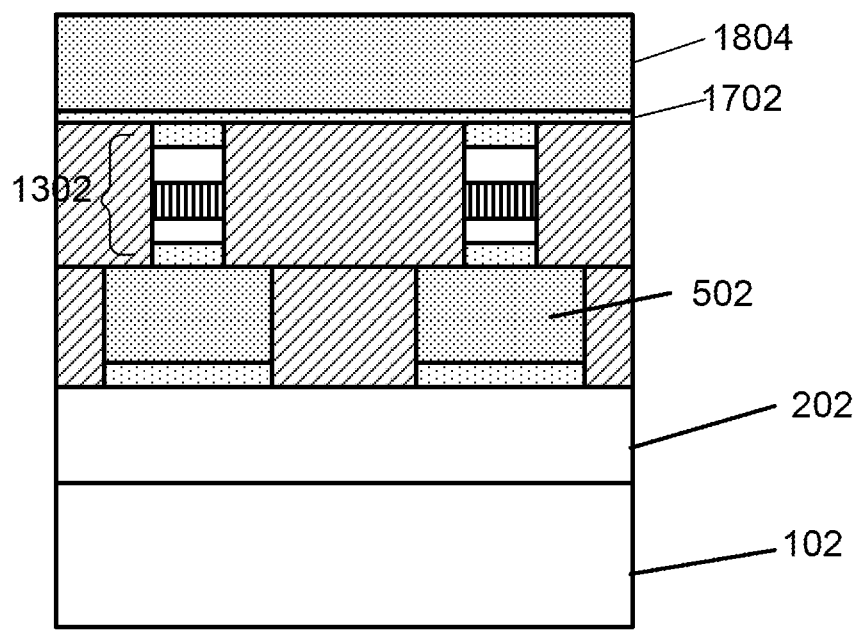
FIG. 18 is a simplified diagram illustrating a device structure for a switching device according to an embodiment of the present invention.

Referring to FIG. 17. The method includes depositing a second adhesion material 1702 overlying the planarized third dielectric layer surface and the top surface region of the pillar structure. The second adhesion layer can be titanium, titanium nitride, tantalum, tantalum nitride, or tungsten nitride or a combination of these. The second adhesion material may be deposited using a physical vapor deposition process such as sputtering in a specific embodiment. Techniques such as a chemical vapor deposition including atomic layer deposition using a suitable precursor may also be used. In a specific embodiment, the method deposits a top wiring material overlying the top contact material. The second wiring material can be tungsten, copper, aluminum or other suitable metal materials including alloys. The top wiring material can be deposited using techniques such as physical vapor deposition, evaporation, chemical vapor deposition, electrochemical methods such as electroplating or electrodeless deposition from a liquid medium, or other suitable deposition techniques including a combination. In certain embodiments, the top wiring material can be a doped semiconductor material such as a doped silicon material. In a specific embodiment, the second adhesion material functions as a glue layer between the top wiring material and the third dielectric layer. Taking tungsten as the second wiring material as an example. Tungsten can have a thickness ranging from about 100 nm to about 1000 nm and preferably ranging from about 200 nm to about 500 nm depending on the application. The method performs a third pattern and etch process to form a top wiring structure 1804 as shown in FIG. 18. The top wiring structure includes the top wiring material and the second adhesion material in a specific embodiment. In a specific embodiment, the top wiring structure is formed at an angle to the bottom wiring structure. In certain embodiments, the top wiring structure is formed orthogonal to the bottom wiring structure. Of course one skilled in the art would recognize other variations, modifications, and alternatives.

In a specific embodiment, the conductive material forms a plurality of conductive material particles including a filament structure in a portion of the switching material when a voltage, for example a forming voltage, is applied to the top wiring structure or the bottom wiring structure. The filament structure is characterized by a length dependent on an amplitude and polarity of a voltage applied to the top electrode or the bottom electrode. Formation of this filament changes the resistance of the switching material in a specific embodiment. Taking silver material as the conductive material and amorphous silicon as the switching material as an example, upon applying a positive voltage to the top wiring structure with respect to the bottom wiring structure, a plurality of silver particles are formed in regions of the amorphous silicon material. The plurality of silver particles can include a silver filament structure having a length. The length of the silver filament structure is caused to change upon applying a certain voltage (for example operating voltage such as write voltage or erase voltage), thus changing the resistance of the amorphous silicon material. Such a device structure is described in U.S. application Ser. No. 11/875,541, filed on Oct. 19, 2007, commonly assigned, and incorporated by reference in its entirety herein.

In a specific embodiment, the top wiring structure, the bottom wiring structure and the switching element sandwiched between the first wiring structure and the second wiring structure provide for a switching device for a non-volatile memory device. Of course one skilled in the art would recognize other variations, modifications, and alternatives.

Figure 3:
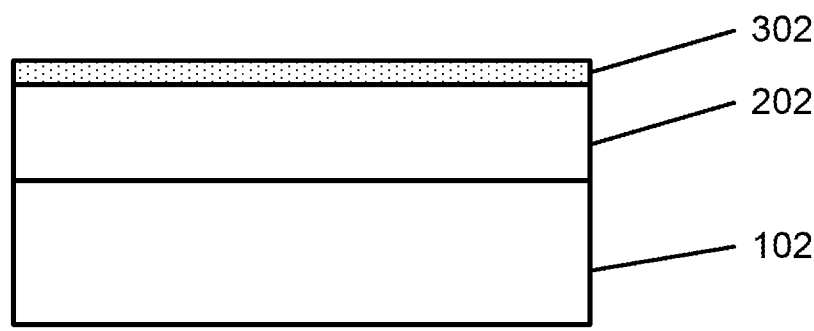
Figure 3A:
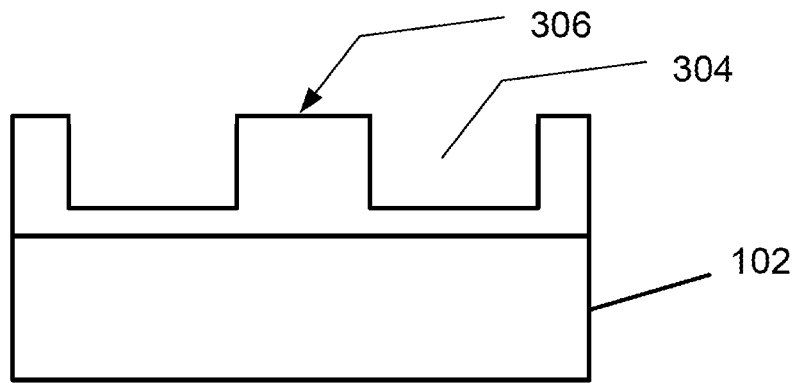
Figure 3B:
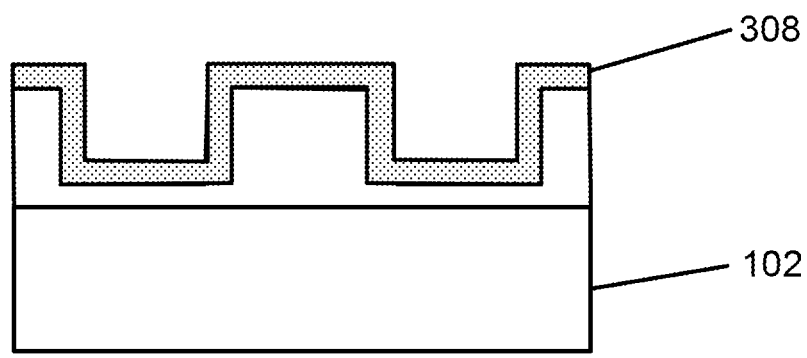
Figure 3C:
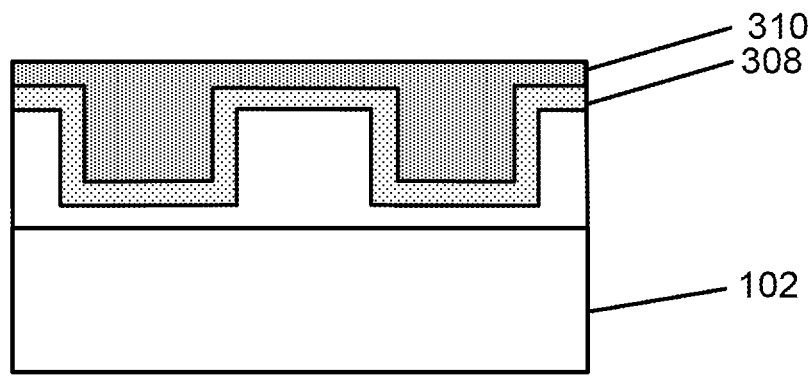
Figure 3D:
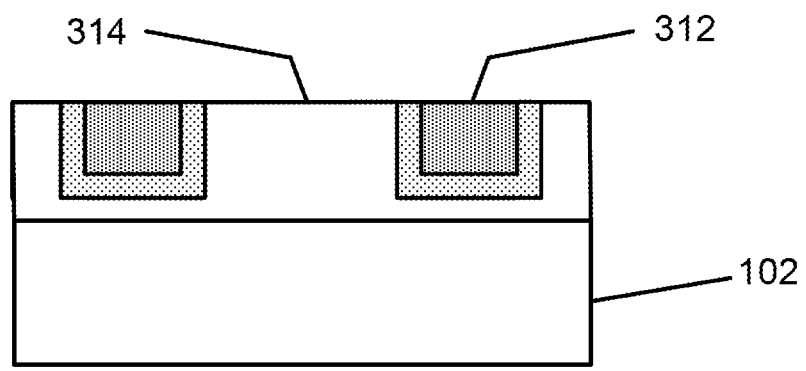

Depending on the embodiment, there can be variations. For example, the first wiring structure may be formed using a first damascene process as illustrated in FIGS. 3A, 3B, 3C, and 3D. The first damascene process includes forming one or more first trench openings 304 in a portion of first dielectric material 202 while a horizontal surface region 306 is exposed using a pattern and dielectric etch process. The one or more first trench openings are configured to extend in the first direction. A first adhesion material 308 is conformably formed overlying the one or more first trench openings including horizontal surface region 306 as shown in FIG. 3B. The first adhesion material can include titanium, titanium nitride, titanium tungsten, tantalum, tantalum nitride, and others, including any combination of these. First wiring material 308 (for example, copper, tungsten, or aluminum) is formed overlying the first adhesion material and to fill each of the one or more trench openings as shown in FIG. 3C. The first wiring material including the first adhesion material is subjected to a first chemical mechanical polishing process to remove the first wiring material and the first adhesion material from the horizontal surface region of the first dielectric material to form one or more first wiring structures 312 and to isolate each of the first wiring structures in a specific embodiment. As shown, the chemical mechanical polishing process also expose surface region 314 of the first dielectric material in a specific embodiment. The method then proceeds to form a bottom metallic barrier material 802 overlying first dielectric surface region 314 and first wiring structure 312 as in FIG. 8 and rest of the process steps in FIG. 9-18.

Similarly, the second wiring structure may be formed using a second damascene process substantially the same as the first damascene process by forming a second trench opening in the third dielectric material (Reference 1502 in FIG. 15) overlying each of structure 1302. The second trench openings are back filled using the second wiring material. The second trench opening is configured to extend in a second direction as in FIG. 18. Of course one skill in the art would recognize other modifications, variations, and alternatives. It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a semiconductor device having a memory device, comprising:

providing a semiconductor substrate having a surface region;

forming a first dielectric layer overlying the surface region of the semiconductor substrate;

forming a first via within the first dielectric layer material;

depositing a liner material within the first via;

depositing a metal-containing material over and in contact with the liner material and filling the first via;

planarizing the liner material and the metal-containing material within the first via along with the first dielectric layer surface, exposing a top surface of the metal-containing material within the first via;

depositing a contact material overlying the metal-containing material within the first via;

depositing an undoped resistive switching silicon material overlying and touching the contact material;

depositing a metal-containing material overlying and touching the undoped resistive switching silicon material;

depositing a top barrier material overlying and touching the conductive metal-containing material;

performing a patterning and etching process to form a plurality of pillar structures from at least the contact material, the undoped resistive switching silicon material, the metal-containing material, and the top barrier material;

depositing a second dielectric material overlying at least the plurality of pillar structures, the second dielectric material having a non-planer surface region;

planarizing the second dielectric material, exposing surface regions of the plurality of pillar structures, the surface regions of the plurality of pillar structures including surface regions of the top barrier material; and forming a top wiring structure overlying at least the surface regions of the plurality of pillar structures,
wherein the forming the top wiring structure comprises:
depositing a third dielectric material above the exposed surface regions of the plurality of pillar structures and a top surface of the second dielectric material;
forming a second via within the third dielectric material;
depositing the liner material within the second via;
depositing the metal-containing material over the liner material and in contact with the liner material and filling the second via;
planarizing the liner material and the metal-containing material within the second via along with the second dielectric layer surface, exposing a top surface of the metal-containing material within the second via.

2. The method of claim 1 further comprising:
depositing a contact material overlying the metal-containing material within the second via;
depositing the undoped resistive switching silicon material overlying and touching the contact material;
depositing the metal-containing material overlying and touching the undoped resistive switching material;
depositing a top barrier material overlying and touching the metal-containing material;
performing a patterning and etching process to form a second plurality of pillar structures from at least the contact material, the undoped resistive switching material, the metal-containing material, and the top barrier material, wherein the second plurality of pillar structures overlie the first plurality of pillar structures;
depositing a third dielectric material overlying at least the second plurality of pillar structures, the third dielectric material having a non-planer surface region;
planarizing the third dielectric material, exposing surface regions of the second plurality of pillar structures, the surface regions of the second plurality of pillar structures including surface regions of the top barrier material; and
forming a second top wiring structure overlying at least the surface regions of the second plurality of pillar structures.

3. The method of claim 1
wherein the semiconductor substrate having a plurality of CMOS devices formed therein; and
wherein the method further comprises:
forming a connection between the metal-containing material within the first via of the first dielectric layer to the plurality of CMOS devices.

4. The method of claim 1 wherein a material for the contact material is selected from a group consisting of: doped polycrystalline silicon-containing material, doped polysilicon, doped polycrystalline silicon and germanium material.

5. The method of claim 1 wherein the undoped resistive switching silicon material is selected from a group consisting of: intrinsic silicon, amorphous silicon, an undoped silicon-containing material.

6. The method of claim 1 wherein the metal-containing material is selected from a group consisting of: a silver-containing material, a gold-containing material, a platinum-containing material, and a palladium-containing material.

7. The method of claim 1 wherein the top barrier metal is selected from a group consisting of: Ti, TiN, Ta, TaN, W and WN.

8. The method of claim 1 wherein the liner material is selected from a group consisting of: titanium, titanium nitride, titanium tungsten, tantalum, tantalum nitride.

9. The method of claim 1 wherein the metal-containing material is selected from a group consisting of: copper, tungsten, aluminum.

10. A method for fabricating a semiconductor device comprises:
forming a via within a first dielectric material layer;
depositing a liner material within the via within the first dielectric material layer;
depositing a metal-containing material over the liner material and filling the via within the first dielectric layer;
planarizing the liner material and the metal-containing material within the via, such that the liner material and a top surface of the metal-containing material are co-planar to the first dielectric layer;
forming a bottom electrode above and in contact with the top surface of the metal-containing material;
forming an undoped resistive switching silicon material layer above and in contact with the bottom electrode;
forming an active metal layer above and in contact with the undoped resistive switching silicon material layer comprising undoped silicon-containing material;
forming a barrier metal layer above and in contact with the active metal layer;
etching at least the barrier metal layer, the active metal layer and the undoped resistive switching silicon material layer to form a plurality of pillars;
disposing a second dielectric material between the plurality of pillars;
planarizing the second dielectric material layer such that a top surface of the barrier metal layer is co-planar to a top surface of the second dielectric material layer;
depositing a third dielectric material layer above the top surface of the barrier metal layer and the top surface of the second dielectric material layer;
forming a via within the third dielectric material layer;
depositing the liner material within the via of the third dielectric material layer;
depositing the metal-containing material over the liner material within the via of the third dielectric material layer and filling the via; and
planarizing the liner material and the metal-containing material within the via of the third dielectric material layer, such that the liner material and a top surface of the metal-containing material are co-planar to the third dielectric layer.

11. The method of claim 10 further comprising:
forming another bottom electrode above and in contact with the top surface of the metal-containing material in the via of the third dielectric material layer;
forming another undoped resistive switching silicon material layer above and in contact with the other bottom electrode;
forming another active metal layer above and in contact with the other undoped resistive switching silicon material layer comprising undoped silicon-containing material;
forming another barrier metal layer above and in contact with the other active metal layer;
etching at least the other barrier metal layer, the other active metal layer and the other undoped resistive switching silicon material layer to form another plurality of pillars;
disposing a fourth dielectric material between the other plurality of pillars; and
planarizing the fourth dielectric material layer such that a top surface of the other barrier metal layer is co-planar to a top surface of the fourth dielectric material layer.

12. The method of claim 10 further comprising:
receiving a semiconductor substrate having a plurality of CMOS devices formed thereon; and
forming a connection between the metal-containing material within the via of the first dielectric material layer to the plurality of CMOS devices.

13. The method of claim 10 wherein a material for the bottom electrode is selected from a group consisting of: doped polycrystalline silicon-containing material, doped polysilicon, doped polycrystalline silicon and germanium material.

14. The method of claim 10 wherein the undoped resistive switching silicon material layer is selected from a group consisting of: intrinsic silicon, amorphous silicon, an undoped silicon-containing material.

15. The method of claim 10 wherein the active metal layer is selected from a group consisting of: a silver-containing material, a gold-containing material, a platinum-containing material, and a palladium-containing material.

16. The method of claim 10 wherein the barrier metal layer is selected from a group consisting of: Ti, TiN, Ta, TaN, W and WN.

17. The method of claim 10 wherein the liner material is selected from a group consisting of: titanium, titanium nitride, titanium tungsten, tantalum, tantalum nitride.

18. The method of claim 10 wherein the metal-containing material is selected from a group consisting of: copper, tungsten, aluminum.

* * * * *